US008329566B2

(12) United States Patent
Zhu et al.

(10) Patent No.: US 8,329,566 B2
(45) Date of Patent: Dec. 11, 2012

(54) METHOD OF MANUFACTURING A HIGH-PERFORMANCE SEMICONDUCTOR DEVICE

(75) Inventors: Huilong Zhu, Poughkeepsie, NY (US); Wenwu Wang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 12/922,391

(22) PCT Filed: Jun. 22, 2010

(86) PCT No.: PCT/CN2010/074205
§ 371 (c)(1),
(2), (4) Date: Jun. 13, 2011

(87) PCT Pub. No.: WO2011/044776
PCT Pub. Date: Apr. 21, 2011

(65) Prior Publication Data
US 2011/0256683 A1    Oct. 20, 2011

(30) Foreign Application Priority Data
Oct. 15, 2009  (CN) .......................... 2009 1 0235780

(51) Int. Cl.
*H01L 21/336* (2006.01)
*H01L 21/36* (2006.01)
*H01L 21/20* (2006.01)
*H01L 21/04* (2006.01)
*H01L 21/425* (2006.01)

(52) U.S. Cl. ........ 438/510; 438/290; 438/298; 438/301; 438/478; 438/524; 257/E21.342; 257/E21.337; 257/E21.43; 257/E21.431; 257/E21.634

(58) Field of Classification Search ........... 257/E21.342, 257/E21.337, E21.43, E21.431, E21.634
See application file for complete search history.

(56) References Cited

U.S. PATENT DOCUMENTS

| 6,300,201 | B1 | 10/2001 | Shao et al. | |
| 6,391,728 | B1 | 5/2002 | Yu | |
| 6,482,724 | B1 * | 11/2002 | Chatterjee | 438/525 |
| 7,456,068 | B2 * | 11/2008 | Kavalieros et al. | 438/301 |
| 7,592,270 | B2 * | 9/2009 | Teo et al. | 438/778 |
| 2002/0001930 | A1 | 1/2002 | Lee | |
| 2003/0022422 | A1 * | 1/2003 | Torii et al. | 438/183 |
| 2006/0148150 | A1 | 7/2006 | Kavalieros et al. | |
| 2009/0108350 | A1 * | 4/2009 | Cai et al. | 257/347 |

FOREIGN PATENT DOCUMENTS
JP     2002-118261 A    4/2002

OTHER PUBLICATIONS

First Office Action for Chinese Patent Application No. 200910235780.7, dated May 19, 2011 (4 pages).

(Continued)

*Primary Examiner* — Mohsen Ahmadi
(74) *Attorney, Agent, or Firm* — Clark & Elbing LLP

(57) ABSTRACT

The present invention relates to a method of manufacturing a semiconductor device, wherein the method comprises: providing a substrate; forming a source region, a drain region, a dummy gate structure, and a gate dielectric layer on the substrate, wherein the dummy gate structure is between the source region and the drain region on the substrate, and the gate dielectric layer is between the substrate and the dummy gate structure; annealing the source region and the drain region; removing the dummy gate structure to form an opening; implanting dopants into the substrate from the opening to form a steep retrograded well; annealing to activate the dopants; and forming a metal gate on the gate dielectric layer by deposition.

9 Claims, 4 Drawing Sheets

OTHER PUBLICATIONS

English Translation of First Office Action for Chinese Patent Application No. 200910235780.7, dated May 19, 2011 (5 pages).
International Search Report for PCT/CN2010/074205 dated Sep. 30, 2010 (5 pages).
English Translation of International Search Report for PCT/CN2010/074205 dated Sep. 30, 2010 (5 pages).

* cited by examiner

METHOD OF MANUFACTURING A HIGH-PERFORMANCE SEMICONDUCTOR DEVICE

CROSS REFERENCE TO RELATED APPLICATIONS

This application is the U.S. National Stage filing under 35 U.S.C. §371 of International Patent Application No. PCT/CN2010/074205, filed Jun. 22, 2010, which claims the benefit of Chinese Patent Application No. 200910235780.7, filed Oct. 15, 2009.

FIELD OF THE INVENTION

The present invention generally relates to a method of manufacturing a semiconductor device, and more specifically, to a method of manufacturing a semiconductor device with a steep retrograded well on a semiconductor substrate.

BACKGROUND OF THE INVENTION

With the development of the semiconductor industry, integrated circuits with higher performance and more powerful functions require greater element density. Thus, the sizes of the components need to be scaled further. Accordingly, in order to improve the performance of the Metal Oxide Semiconductor Field Effect Transistor (MOSFET), the gate length of the MOSFET should be further reduced. However, with the continuous reduction of the gate length, when the gate length is reduced to approach the width of the depletion layer of the source and the drain, for example less than 40 nm, severe short channel effects (SCE) occur, which disadvantageously leads to deterioration of device performance and difficulty for large scale production of integrated circuit. It has become a challenge in large scale production of integrated circuits to reduce and effectively control the short channel effects.

A solution to improve the short channel effects by forming a steep retrograded well in the substrate may be used to alleviate the short channel effects. This solution is based on forming a steep retrograded well in a channel to decrease the width of the depletion layer under the gate and further reduce the short channel effect. Hence, it usually requires a very steep distribution for the retrograded well to achieve good effects. Rapid annealing is typically used to activate dopants and eliminate the defects caused by ion implantation to the source/drain region. The thermal budget in annealing of the source region and drain region as well as the source/drain extensions is too high, thus the temperature and time required to form atom diffusion by this annealing is much higher than that needed by annealing of the channel dopants. As a result, the dopants in channel are unfavorably overly diffused, and the distribution of the retrograded well is no longer steep.

Therefore, in order to improve the manufacture of high-performance semiconductor devices, there is a need for a method to produce steep retrograded distribution.

SUMMARY OF THE INVENTION

In view of the above-mentioned problems, the present invention proposes a method of manufacturing a semiconductor device. The method comprises: providing a substrate; forming a source region, a drain region, a dummy gate structure, and a gate dielectric layer on the substrate, wherein the dummy gate structure is between the source region and the drain region on the substrate, and the gate dielectric layer is between the substrate and the dummy gate structure; annealing the source region and the drain region; removing the dummy gate structure to form an opening; implanting dopants into the substrate from the opening to form a steep retrograded well; annealing to activate the dopants; forming a metal gate on the gate dielectric layer by deposition. Flash annealing or laser annealing may be used for annealing the device so as to activate the dopants.

By forming the steep retrograded well after thermal annealing the drain/source regions and the extension region, and activating the dopants in the retrograded well by annealing, the present invention advantageously avoids negative influence on the steepness of the retrograded well distribution caused by thermal annealing of the source/drain regions and extension regions. Furthermore, the present invention can well reduce the power consumption and control the short channel effects because of the decrease of the leakage current among energy bands and the depth of the depletion layer in the channel region of the semiconductor device.

DETAILED DESCRIPTION OF THE INVENTION

The present invention generally relates to a method of manufacturing a semiconductor device, and more particularly, to a method of forming a semiconductor device with a steep retrograded well on a semiconductor substrate. The following disclosure provides a plurality of different embodiments or examples to achieve different structures of the present invention. To simplify the disclosure of the present invention, description of the components and arrangements of specific examples is given below. Of course, they are only illustrative and not limiting the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for a person of ordinary skill in the art that other process and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

Figure 1:
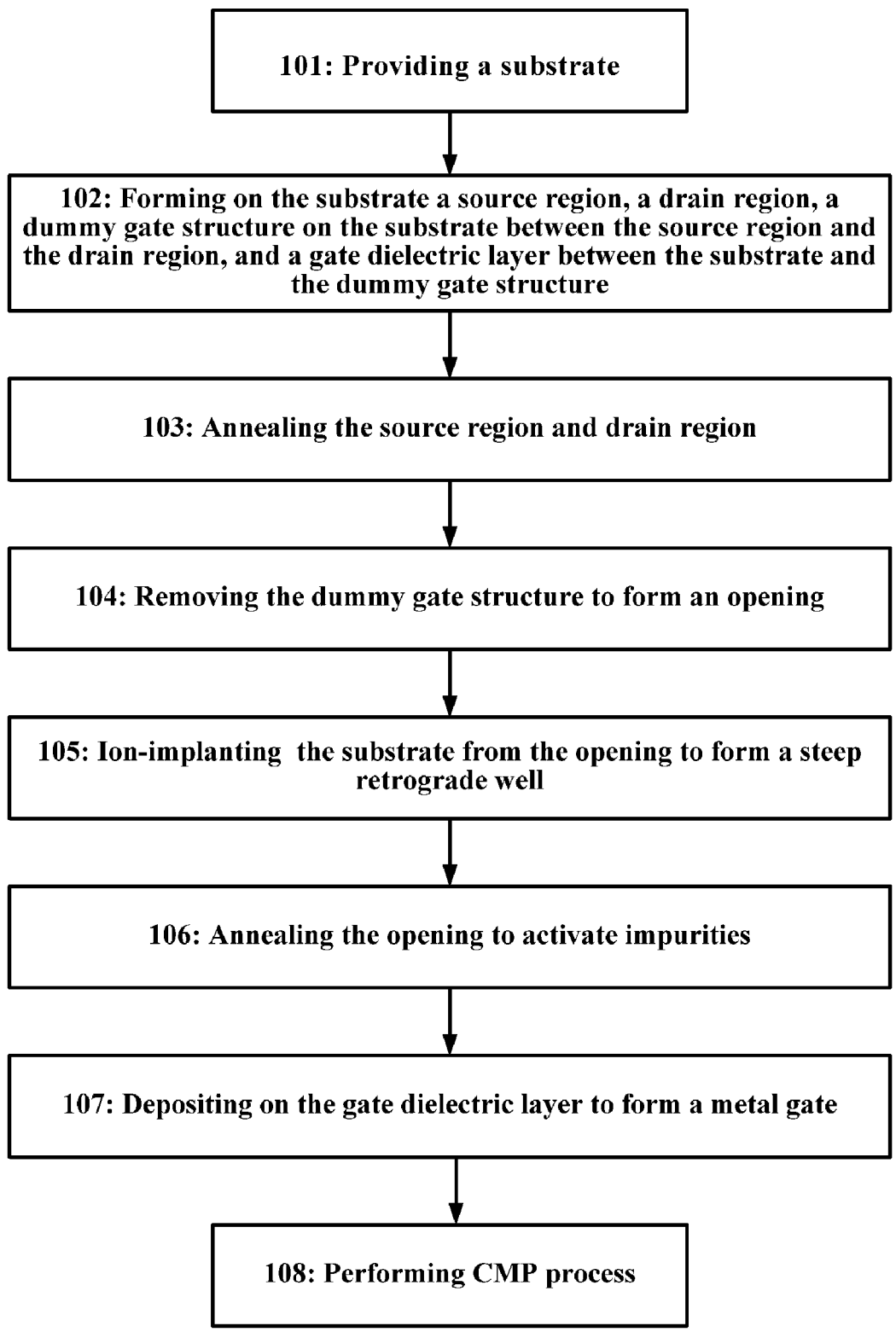
FIG. 1 is a flowchart illustrating a method of manufacturing a semiconductor device according to an embodiment of the present invention.
Figure 2:
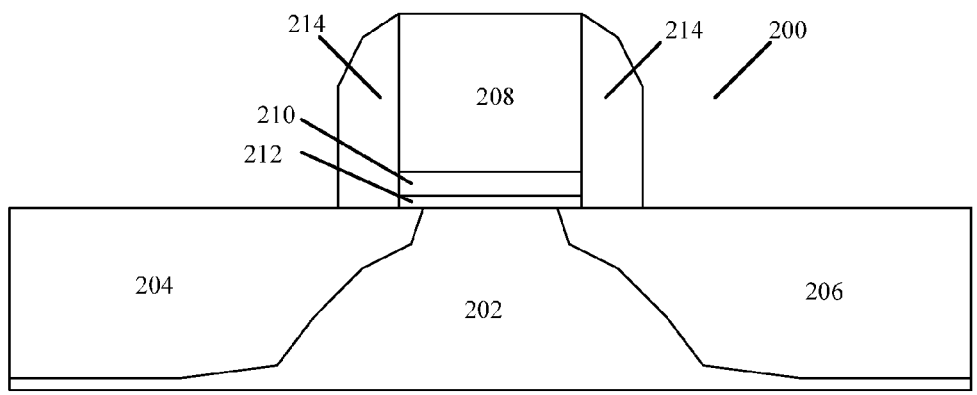
FIGS. 2-7 are structural diagrams illustrating the semiconductor devices according to various aspects of the present invention.

With reference to FIG. 1, FIG. 1 is a flowchart illustrating a method of manufacturing a semiconductor device according to an embodiment of the present invention. In step 101, a semiconductor substrate 202 is provided, as shown in FIG. 2. In this embodiment, the substrate 202 includes a crystalline silicon substrate (for example a wafer). According to the design specifications known in the prior art (for example, a p-type substrate or an n-type substrate), the substrate 202 may be of various doping configurations. Other examples of the substrate 202 may also include other semiconductor, for example germanium and diamond. Alternatively, the substrate 202 may include compound semiconductors, such as SiC, GaAs, and InAs or InP. In addition, the substrate 202 may include an epitaxial layer, may be under stress to enhance performance, and/or may include a SOI (silicon on insulator) structure.

In step 102, a source region 204, a drain region 206, a dummy gate structure 208, and a gate dielectric layer 212 are formed on the substrate 202, wherein the dummy gate structure 208 is between the source region 204 and the drain region 206 on the substrate 202, and the gate dielectric layer 212 is between the substrate 202 and the dummy gate structure 208. In some embodiments, a work function metal gate layer 210 is formed between the gate dielectric layer 212 and the dummy gate structure 208.

The dummy gate structure 208 is a sacrificial layer. The dummy gate structure 208 may be, for example, polysilicon. In one embodiment, the dummy gate structure 208 may include amorphous silicon. The dummy gate structure 208 may be formed by a traditional Metal Oxide Semiconductor (MOS) process, such as polysilicon deposition, lithography, etching and/or other appropriate methods. The gate dielectric layer 212 may include high dielectric constant (high-k) materials. In one embodiment, the high-k materials may include hafnium dioxide ($HfO_2$). Other examples of high-k materials may include HfSiO, HfSiON, HfTaO, HfSiO, HfZrO, and/or other appropriate materials and any combination thereof. The gate dielectric layer 212 may have a thickness in a range from about 15 Å to 40 Å. The gate dielectric layer 212 may be formed by such techniques as thermal oxidation, chemical vapor deposition (CVD) or atomic layer deposition (ALD). The gate dielectric layer 212 may have a multilayer structure, including more than one layer of above-mentioned materials. Particularly, after the gate dielectric layer 212 is formed, the work function metal gate layer 210 may be deposited thereon. The work function metal gate layer may have a thickness in a range from about 30 Å to about 150 Å. The materials used for the work function metal gate layer may include TiN and TaN.

Sidewall spacers 214 may be formed on the two sidewalls of the dummy gate structure 208. The sidewall spacers 214 may be formed of silicon nitride, silicon dioxide, silicon oxynitride, silicon carbide, fluorine-doped silicate glass, low-k dielectric materials, and/or other materials as appropriate and any combination thereof. The sidewall spacers 214 may have a multilayer structure. The sidewall spacers 214 may be formed by appropriate methods, including depositing appropriate dielectric materials.

The source region 204 and drain region 206 may be formed by implanting, depending on desired transistor structure, p-type or n-type dopants into the substrate 202. The source region 204 and drain region 206 may be formed by a method including lithography, ion implantation, diffusion and/or other process as appropriate. The source region 204 and drain region 206 may be formed prior to the formation of the gate dielectric layer 212.

Figure 3:
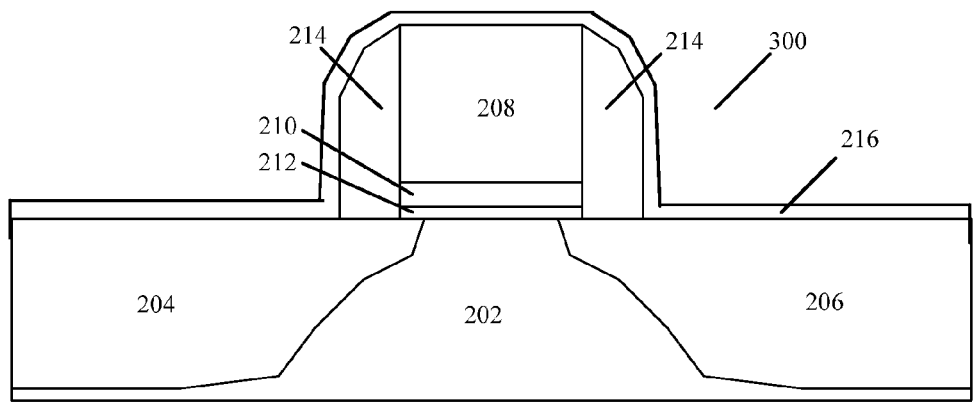

In particular, referring to FIG. 3, a stop layer 216 covering the semiconductor device may be formed on the semiconductor device. The stop layer may include $Si_3N_4$, silicon oxynitride, silicon carbide and/or other materials as appropriate. The stop layer 216 may be formed by using a method such as chemical vapor deposition (CVD), physical vapor deposition (PVD), atomic layer deposition (ALD) and/or other process as appropriate. In one embodiment, the thickness of the stop layer 216 is in a range from about 50 Å to 200 Å.

Figure 4:
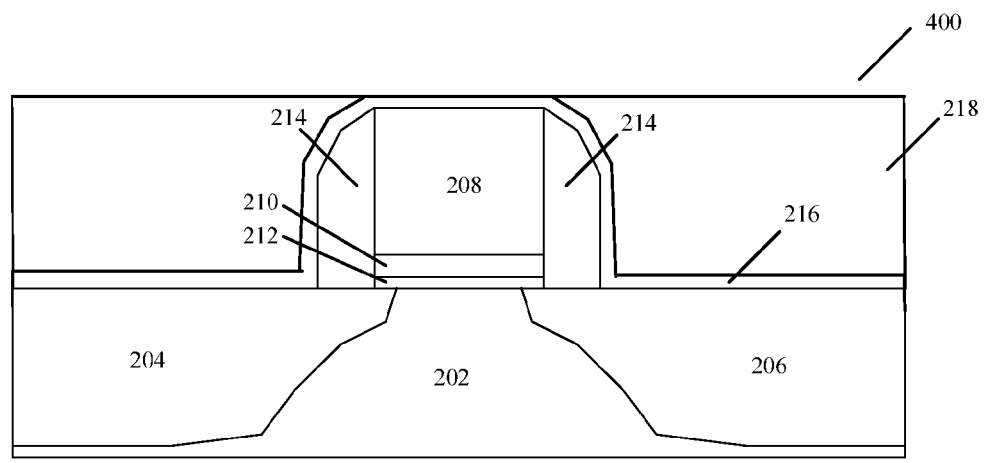

The dielectric layer 218 may be formed on the stop layer 216 by a method such as chemical vapor deposition (CVD), high density plasma CVD, spin-coating, sputtering or other methods as appropriate, as illustrated in FIG. 4. The dielectric layer 218 may include silicon oxide, silicon oxynitride or low-k materials. In particular, the dielectric layer 218 is formed of materials with smaller hardness than that of the stop layer 216 so as to stop on the stop layer 216 in the subsequent chemical mechanical polishing (CMP) process.

The flow then goes to step 103 in which the source region 204 and the drain region 206 are annealed. The annealing may be carried out by using rapid thermal annealing, spike annealing and other process that are known to a person skilled in the art.

Figure 5:
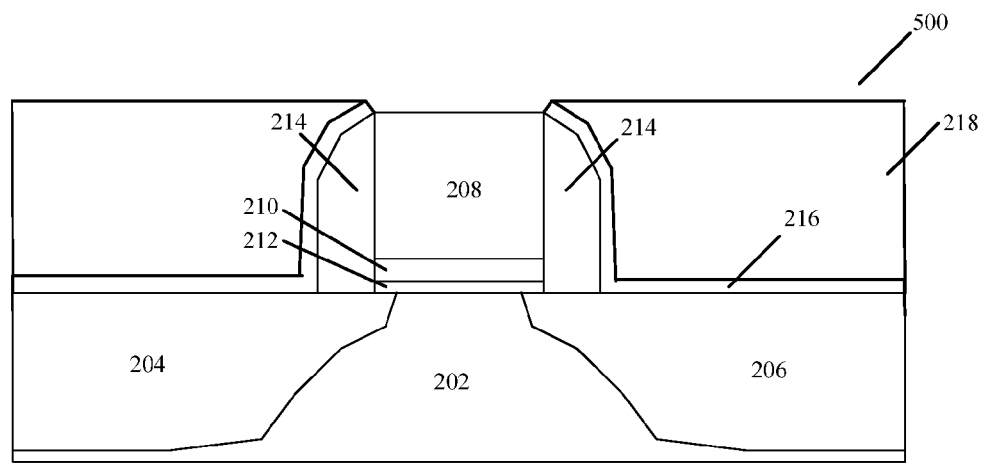
Figure 6:
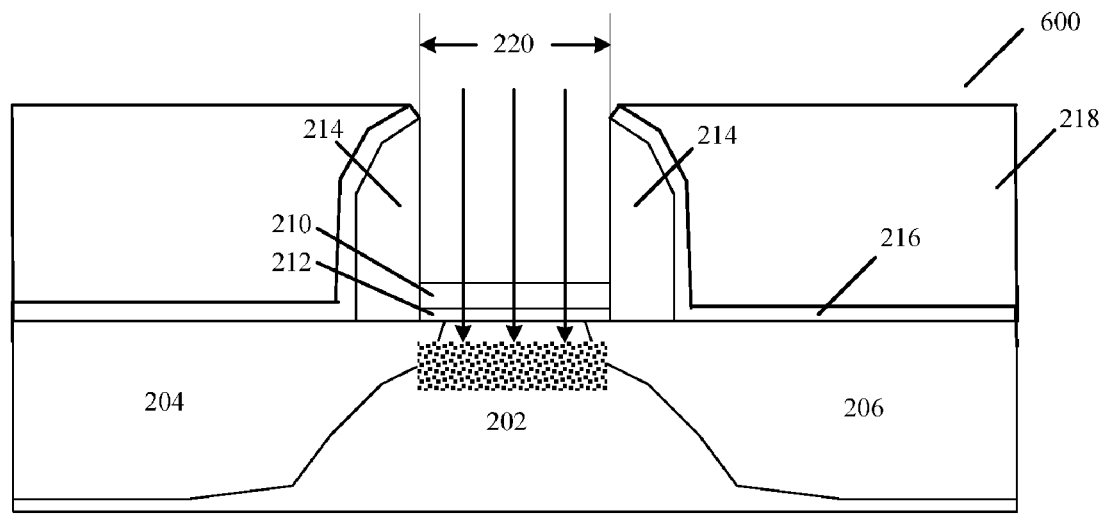

In step 104, the dummy gate structure 208 may be removed, and accordingly a metal gate may be formed to substitute the dummy gate structure 208. Afterwards, the dielectric layer 218 may be planarized, for example, by CMP process until the stop layer 216 is exposed, as illustrated in FIG. 4. Then the exposed stop layer 216 is selectively etched so as to expose the dummy gate structure 208, as illustrated in FIG. 5. The stop layer 216 may be removed by using wet etching and/or dry etching. Subsequently, the dummy gate structure 208 is removed and a device 600 as illustrated in FIG. 6 is provided. For example, by selectively etching polysilicon and stopping on the work function metal gate 210, the dummy gate structure 208 is removed and the opening 220 is formed. The dummy gate structure 208 may be removed by using wet etching and/or dry etching. In one embodiment, the wet etching process may include chemicals such as hydroxide solution (for example ammonium hydroxide), de-ionized water and/or other etchant solutions as appropriate.

The flow then goes to step 105, in which the substrate 202 is implanted by dopants from the opening 220 to form a steep retrograded well, as illustrated in FIG. 6. For an n-type semiconductor device, the dopant implantation is performed by group III elements, for example boron and indium. For a p-type semiconductor device, the dopant implantation is performed by group V elements, for example arsonium and phosphorus. The energy of ion implantation is in the range of about 3-25 keV, the implantation dose is about 5e13-2e14, and the implantation depth is in the range of about 10-25 nm.

In step 106, the device is annealed so as to activate the dopants in the retrograded well. In other embodiments, other annealing process may be used, for example laser annealing, flash annealing, etc. According to the embodiments of the present invention, the device is typically annealed by instant annealing process, for example, laser annealing in microsecond level at the temperature of above 1350.

Figure 7:
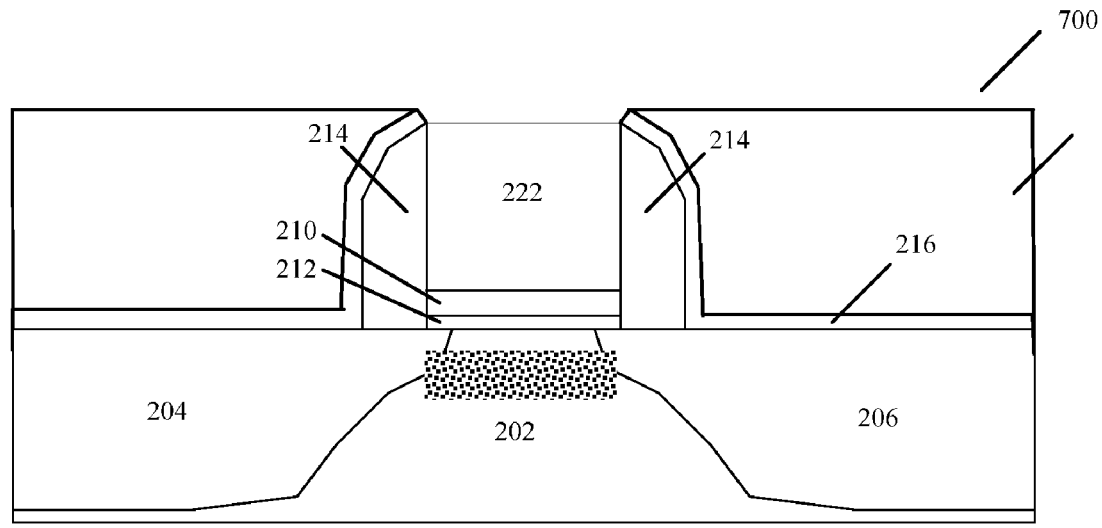

In step 107, deposition is performed on the gate dielectric layer to form a metal gate. FIG. 7 illustrates a device 700 including a metal gate 222 which is deposited into the opening 220 and used for adjusting a threshold voltage. The metal gate 222 may include one or more material layers, for example one or more liners, so as to provide materials with suitable work functions and/or other materials as appropriate to the gate. For an n-type semiconductor device, one or more materials may be deposited selecting from the following group comprising TaC, TiN, TaTbN, TaErN, TaYbN, TaSiN, HfSiN, MoSiN, $RuTa_x$, $NiTa_x$, and any combination thereof. For a p-type semiconductor device, one or more materials may be deposited selecting from the following group comprising $MoN_x$, TiSiN, TiCN, TaAlC, TiAlN, TaN, $PtSi_x$, $Ni_3Si$, Pt, Ru, Ir, Mo, HfRu, $RuO_x$, and any combination thereof.

Finally, in step 108, chemical mechanical polishing (CMP) process is performed on the device 700 to form the metal gate 222 and provide the device 700 in which the steep retrograded well and the deposited metal gate 222 are formed.

By forming the steep retrograded well after thermal annealing of the drain/source region and the extension region, and activating the dopants in the retrograded well by laser annealing, the present invention advantageously avoids negative influence on the steepness of the retrograded well distribution caused by thermal annealing of the source/drain regions and extension regions. Meanwhile, in the present invention, the depth of the depletion layer in the channel region of the semiconductor device is decreased, thereby the short channel effects are well controlled. Furthermore, because the retrograded well distribution is not overlapped with the doping of the source/drain regions, the band-band leakage current in MOSFET devices may be reduced.

Although the embodiments and their advantages have been described in detail, it is readily apparent to those having ordinary skill in the art that various alterations, substitutions and modifications may be made to the embodiments without departing from the spirit of the present invention and the scope as defined by the appended claims. For other examples, it may be easily recognized by a person of ordinary skill in the art that the order of the process steps may be changed without departing from the scope of the present invention.

In addition, the scope to which the present invention is applied is not limited to the process, mechanism, manufacture, material composition, means, methods and steps described in the specific embodiments in the specification. A person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method of manufacturing a semiconductor device, comprising:
    a) providing a substrate;
    b) sequentially forming a source region, a drain region, a dummy gate structure, a gate dielectric layer on the substrate and sidewall spacers on sidewall surfaces of the dummy gate structure, wherein the dummy gate structure is between the source region and the drain region on the substrate, and the gate dielectric layer is between the substrate and the dummy gate structure; then
    c) forming a stop layer covering the source region, the drain region, the dummy gate structure, the gate dielectric layer on the substrate and sidewall spacers; then
    d) forming a dielectric layer on the top of the stop layer;
    e) performing a chemical Mechanical Polishing (CMP) so as to stop on the stop layer;
    f) annealing the source region and the drain region;
    g) removing the dummy gate structure to form an opening;
    h) implanting dopants into the substrate from the opening to form a steep retrograded well;
    i) annealing to activate the dopants; and
    j) forming a metal gate on the gate dielectric layer by deposition;
    wherein step b) additionally comprises forming a work function metal gate layer prior to the formation of the dummy gate structure, such that the work function metal gate layer is between the gate dielectric layer and the dummy gate structure.

2. The method according to claim 1, wherein step f) comprises laser annealing above 1350° C. or flash annealing to activate the dopants.

3. The method according to claim 1, wherein step e) comprises: for an n-type semiconductor device, the implanting is performed by using Group III elements; and for a p-type semiconductor device, the implanting is performed by using Group V elements.

4. The method according to claim 3, wherein the Group III elements include boron and indium, the Group V elements include arsenic and phosphorus, the energy of the implanting is in the range of 3-10 keV, and the implantation dose is 5e13-2e14.

5. The method according to claim 1, wherein the depth of the ion implanting is in the range of 10-25 nm.

6. The method according to claim 1, wherein step g) further comprises: for an n-type semiconductor device, one or more materials are deposited selecting from the following group comprising TaC, TiN, TaTbN, TaErN, TaYbN, TaSiN, HfSiN, MoSiN, RuTa$_x$, NiTa$_x$ and any combination thereof; for a p-type semiconductor device, one or more materials are deposited selecting from the following group comprising MoN$_x$, TiSiN, TiCN, TaAlC, TiAlN, TaN, PtSi$_x$, Ni$_3$Si, Pt, Ru, Ir, Mo, HfRu, RuO$_x$ and any combination thereof.

7. The method according to claim 1, wherein step c') further comprises: performing chemical mechanical polishing to stop at the stop layer, and selectively etching the stop layer to expose the dummy gate structure.

8. The method according to claim 1, wherein the material(s) for the stop layer is selected from the group comprising Si$_3$N$_4$, silicon oxynitride, silicon carbide and any combination thereof; and the material(s) for the dielectric layer is selected from the group comprising silicon oxide, silicon oxynitride and any combination thereof.

9. The method according to claim 8, wherein the stop layer has a greater hardness than that of the dielectric layer.

* * * * *